US006876052B1

(12) United States Patent
Tai (10) Patent No.: US 6,876,052 B1
(45) Date of Patent: Apr. 5, 2005

(54) PACKAGE-READY LIGHT-SENSITIVE INTEGRATED CIRCUIT AND METHOD FOR ITS PREPARATION

(75) Inventor: Ching K. Tai, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/570,181

(22) Filed: May 12, 2000

(51) Int. Cl.$^7$ .......................................... H01L 31/0203
(52) U.S. Cl. ........................ 257/433; 257/778; 257/787; 257/788; 257/435; 257/436; 438/48; 438/64; 438/108
(58) Field of Search ........................ 257/433, 435, 257/436, 778, 787, 788, 737, 738, 686; 438/48, 64, 108

(56) References Cited

U.S. PATENT DOCUMENTS

| | | | | |
|---|---|---|---|---|
| 3,839,660 A | * | 10/1974 | Stryker | 357/67 |
| 4,248,920 A | * | 2/1981 | Yoshizumi et al. | 428/76 |
| 5,087,964 A | * | 2/1992 | Hatta | 357/74 |
| 5,149,958 A | * | 9/1992 | Hallenbeck et al. | 250/216 |
| 5,355,016 A | * | 10/1994 | Swirbel et al. | 257/659 |
| 5,557,150 A | * | 9/1996 | Variot et al. | 257/787 |
| 5,726,501 A | * | 3/1998 | Matsubara | 257/778 |
| 5,834,323 A | * | 11/1998 | Ghafghaichi et al. | 438/118 |
| 5,965,933 A | * | 10/1999 | Young et al. | 257/621 |
| 5,969,426 A | * | 10/1999 | Baba et al. | 257/778 |
| 6,015,505 A | * | 1/2000 | David et al. | 252/79.2 |
| 6,034,441 A | * | 3/2000 | Chen | 257/787 |
| 6,043,429 A | * | 3/2000 | Blish, II et al. | 174/35 R |
| 6,118,180 A | * | 9/2000 | Loo et al. | 228/180.22 |
| 6,121,656 A | * | 9/2000 | Tanaka et al. | 257/323 |
| 6,198,087 B1 | * | 3/2001 | Boon | 250/208.1 |
| 6,201,309 B1 | * | 3/2001 | Honda et al. | 257/788 |
| 6,249,044 B1 | * | 6/2001 | Kao et al. | 257/678 |
| 6,265,784 B1 | * | 7/2001 | Kawano et al. | 257/737 |
| 6,373,140 B1 | * | 4/2002 | Onodera et al. | 257/690 |
| 6,468,413 B1 | * | 10/2002 | Fanti et al. | 205/682 |
| 6,528,894 B1 | * | 3/2003 | Akram et al. | 257/788 |

FOREIGN PATENT DOCUMENTS

JP 58134449 * 8/1983 .................. 257/659

* cited by examiner

Primary Examiner—Tom Thomas
Assistant Examiner—Eugene Lee
(74) Attorney, Agent, or Firm—Mark C. Pickering (57) ABSTRACT

A package-ready light-sensitive integrated circuit and process for preparing a light-sensitive semiconductor substrate for packaging that provide for a reduced exposure of a light-sensitive integrated circuit to light. The package-ready light-sensitive integrated circuit includes a semiconductor substrate (e.g., a silicon wafer) with an upper surface and a lower surface and lateral edges, an individual light-sensitive integrated circuit formed in and on the upper surface of the semiconductor substrate, and an opaque material layer covering the lower surface and lateral edges of the semiconductor substrate. The opaque material layer prevents light from entering the semiconductor substrate and interfering with operation of the light-sensitive integrated circuit. The process includes first providing at least one semiconductor substrate with a plurality of light-sensitive integrated circuits formed in and on its upper surface. Next, the semiconductor substrate(s) is diced to form individual light-sensitive integrated circuits, each of which has a semiconductor substrate lower surface and semiconductor substrate lateral edges. The individual light-sensitive integrated circuits are then transferred into a magazine and their semiconductor substrate lower surface and semiconductor substrate lateral edges covered (for example by injection molding) with an opaque material (e.g., an opaque molding compound or opaque epoxy) to form an opaque material layer thereon, thereby forming coated light-sensitive integrated circuits. The coated light-sensitive integrated circuits are then removed from the magazine.

21 Claims, 4 Drawing Sheets

PACKAGE-READY LIGHT-SENSITIVE INTEGRATED CIRCUIT AND METHOD FOR ITS PREPARATION

BACKGROUND OF THE INVENTION

1. Field of the Invention

The present invention relates to integrated circuit packages and packaging methods and, in particular, to packages and packaging methods for light-sensitive integrated circuits.

2. Description of the Related Art

Traditional integrated circuit packages and packaging methods provided for an integrated circuit (also known as a "chip" or "die") to be connected to an external system and protected from deleterious environmental factors, such as moisture. In order to provide an integrated circuit package of minimum size, it can be desirable to essentially utilize the integrated circuit's semiconductor substrate (e.g., a silicon wafer) as a portion of the package. For example, in "flip chip" packaging processes, bond pads (for the provision of input signals, output signals, supply voltage and ground) on the upper surface of an integrated circuit are directly connected to package bond pads (for example, bond pads on a printed circuit board [PCB]) via solder bumps. During such a flip chip packaging process, an integrated circuit with attached solder bumps is flipped over and aligned with package bond pads. The solder bumps are then subjected to reflow processing in order to attach the bond pads of the integrated circuit to the package bond pads. In this scenario, the semiconductor substrate, on which the integrated circuit was formed, can remain exposed and be used as a portion of a completed integrated circuit package.

Figure 1:
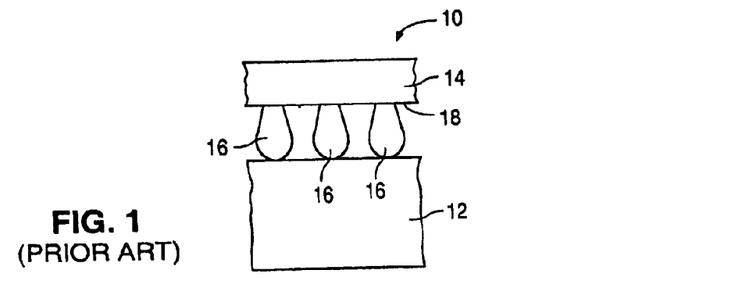
FIG. 1 is a side view of a portion of a conventional flip chip package.

FIG. 1 illustrates a portion of a conventional flip chip package 10. Flip chip package 10 includes a printed circuit board 12, an integrated circuit (not shown) formed in and on a semiconductor substrate 14 and solder bumps 16. Solder bumps 16 are attached to bond pads (not shown) on the upper surface 18 of the semiconductor substrate 14. As described above, the solder bumps 16 serve to connect bond pads on the integrated circuit to bond pads (also not shown) on the printed circuit board 12.

A drawback of flip chip packages and packaging processes, and other packages and packaging processes that do not completely enclose the semiconductor substrate and/or integrated circuit with opaque materials, is that the integrated circuit remains exposed to various light sources (e.g., artificial incandescent sources or the sun). For example, an integrated circuit formed in and on a semiconductor substrate may be placed in a non-opaque package to create an esthetically pleasing design for cell phones and other consumer products. These designs, however, expose the integrated circuit to light. For light-sensitive integrated circuits, such exposure can lead to interference with the operation of the light-sensitive integrated circuit, including unwelcome electrical currents/voltages, performance degradation, malfunction or shutdown.

Opaque layers can be applied to the lower surface of a semiconductor substrate after multiple integrated circuits have been formed in and on its upper surface (i.e., when the integrated circuits are in wafer form). However, prior to packaging, integrated circuits in wafer form are diced (for example by being sawn) into individual integrated circuits. The dicing process exposes lateral edges of the semiconductor substrate, through which an integrated circuit can be exposed to light In addition, the integrated circuit can be exposed to reflected light on its upper surface.

Still needed in the field, therefore, is a package-ready light-sensitive integrated circuit and a process for preparing light-sensitive integrated circuits for packaging that provides for a reduced exposure of the integrated circuit to light. In addition, the process should be simple, inexpensive, and should provide a package-ready light-sensitive integrated circuit of a relatively small size (i.e., a size only marginally greater than the size of a conventional die).

SUMMARY OF THE INVENTION

The present invention provides a package-ready light-sensitive integrated circuit that provides for a reduced exposure of the integrated circuit to light. Package-ready light-sensitive integrated circuits according to the present invention are also relatively small, being only slightly larger than a conventional die.

Package-ready light-sensitive integrated circuits according to the present invention include a semiconductor substrate (e.g., a silicon substrate). The package-ready light-sensitive integrated circuits also include an individual light-sensitive integrated circuit formed in and on an upper surface of the semiconductor substrate, while an opaque material layer covers the lower surface and lateral edges of the semiconductor substrate. The opaque material layer prevents light from entering the semiconductor substrate through its lateral edges and lower surface, thereby eliminating its interference with the operation of the light-sensitive integrated circuit.

The present invention also provides a process for preparing a light-sensitive integrated circuit for packaging that provides a reduced exposure of the integrated circuit to light. This reduced exposure to light is accomplished by covering the lower surface and lateral edges of the semiconductor substrate with an opaque material layer. The inventive processes are simple and inexpensive, and employ, for example, opaque epoxy or opaque molding compound in the opaque material layer.

Processes in accordance with the present invention include providing at least one semiconductor substrate (e.g., a silicon wafer) with a plurality of light-sensitive integrated circuits formed in and on its upper surface. Next, the semiconductor substrate(s) is diced to form individual light-sensitive integrated circuits, each of which has a semiconductor substrate lower surface and semiconductor substrate lateral edges. The individual light-sensitive integrated circuits are then transferred into a magazine, for example, a magazine adapted for injection molding. Next, the semiconductor substrate lower surface and semiconductor substrate lateral edges of the individual light-sensitive integrated circuits are covered with an opaque material to form an opaque material layer.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 2:
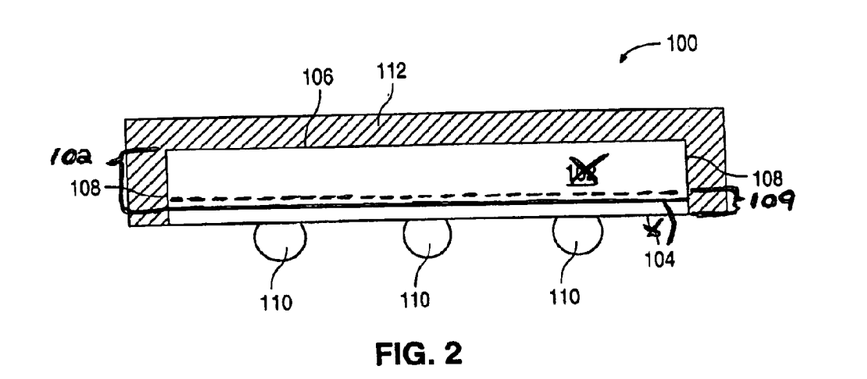
FIG. 2 is a cross-sectional side view of a package-ready light-sensitive integrated circuit according to the present invention.

FIG. 2 illustrates a package-ready light-sensitive integrated circuit 100 according to the present invention in cross-section. Package-ready light-sensitive integrated circuit 100 includes a semiconductor substrate 102 (e.g., a silicon substrate) with an upper surface 104, a lower surface 106 and lateral edges 108. An individual light-sensitive integrated circuit 109 with attached solder bumps 110 is present In and on the upper surface 104 of the semiconductor substrate 102. While In the embodiment of FIG. 2, the individual light-sensitive integrated circuit 109 has solder bumps 110 attached thereto, the present invention can utilize other combinations of a semiconductor substrate and an individual light-sensitive integrated circuit known in the art that do not employ solder bumps. Package-ready light-sensitive integrated circuit 100 also includes an opaque material layer 112 covering the lower surface 106 and lateral edges 108 of the semiconductor substrate 102. Once apprised of the present disclosure, one skilled in the art will recognize that semiconductor substrate 102 typically has four lateral edges coated with opaque layer 112, although only two are visible in the cross-sectional view of FIG. 2.

The opaque material layer 112 prevents light from entering the semiconductor substrate 102 through the lateral edges 108 and lower surface 106, thereby eliminating its interference with the operation of the individual light-sensitive integrated circuit 109. The opaque material layer 112 can be formed, for example, of opaque ink, opaque paint, opaque epoxy, opaque molding compound or opaque resin. The thickness of the opaque material layer 112 is sufficient to block essentially all light of wavelengths that can interfere with operation of the individual light-sensitive integrated circuit 109 (e.g., visible light, light of infra-red wavelengths or ultra-violet light) from entering the semiconductor substrate 102. The thickness will, therefore, depend on the light blocking characteristics of the opaque material layer 112 for the light wavelength(s) of interest. It is preferred that the thickness of the opaque material layer 112 be minimized (while still remaining sufficiently thick to block light) in order to provide a package-ready light-sensitive integrated circuit of a size that is as close as possible to a conventional uncoated die.

When an opaque epoxy, opaque molding compound or opaque resin is employed to form the opaque material layer 112, the opaque material layer 112 also enhances the mechanical strength of the a package-ready light-sensitive integrated circuit. In this circumstance, a typical thickness for an epoxy-based opaque material layer 112 is in the range of 3 mils to 11 mils (i.e., 0.003 inches to 0.011 inches). Epoxy, molding compound and resin-based opaque layers can be formed, for example, using pouring or injection molding techniques. Alternatively, opaque ink or opaque paint can, for example, be sprayed onto the semiconductor substrate 102 to form the opaque material layer 112.

Figure 3:
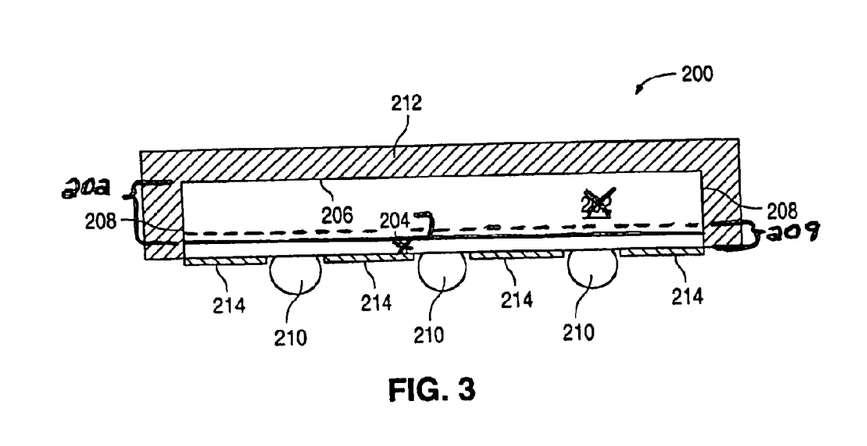
FIG. 3 is a cross-sectional side view of another package-ready light-sensitive integrated circuit according to the present invention.

FIG. 3 illustrates, in cross-section, another embodiment of package-ready light-sensitive integrated circuit 200 according to the present invention. Package-ready light-sensitive integrated circuit 200 includes a semiconductor substrate 202 with an upper surface 204, a lower surface 206 and lateral edges 208. An individual light-sensitive integrated circuit 209 with attached solder bumps 210 is present in and on the upper surface 204 of the semiconductor substrate 202. While in the embodiment of FIG. 3, the individual light-sensitive integrated circuit 209 has solder bumps 210 attached thereto, the present invention can also utilize other combinations of semiconductor substrate and individual light-sensitive integrated circuit known in the art that do not employ solder bumps. Package-ready light-sensitive integrated circuit 200 also includes an opaque material layer 212 covering the lower surface 206 and lateral edges 208 and a light-barrier metal layer 214 partially overlying the upper surface 204 and the individual light-sensitive integrated circuit 209.

The opaque material layer 212 prevents light from entering the semiconductor substrate 202 through the lateral edges 208 and lower surface 206, thereby eliminating its interference with the operation of the light-sensitive integrated circuit 209. The opaque material layer 112 can be formed, for example, of opaque ink, opaque paint, opaque epoxy, opaque molding compound or opaque resin. The light-barrier metal layer 214 prevents light from entering the semiconductor substrate 202 through the upper surface 204, thereby eliminating its interference with the operation of the individual light-sensitive integrated circuit 209.

Light-barrier metal layer 214 can be formed (using, for example, conventional sputtering, masking and metal etching techniques) from any metal that is capable of blocking light, such as titanium-tungsten (TiW) or aluminum (Al). The thickness of the light-blocking metal layer 214 is sufficient to block essentially all of the light of wavelengths that can interfere with operation of the individual light-sensitive integrated circuit 209 (e.g., visible light, light of infra-red wavelengths or ultra-violet light) from entering the semiconductor substrate 202. The thickness will, therefore, depend on the light blocking characteristics of the light-barrier metal layer 214 for the light wavelength(s) of interest. A typical thickness for a TiW light-barrier metal layer or an Al light-barrier metal layer is, however, in the range from 300 angstroms to 20,000 angstroms.

Figure 4:
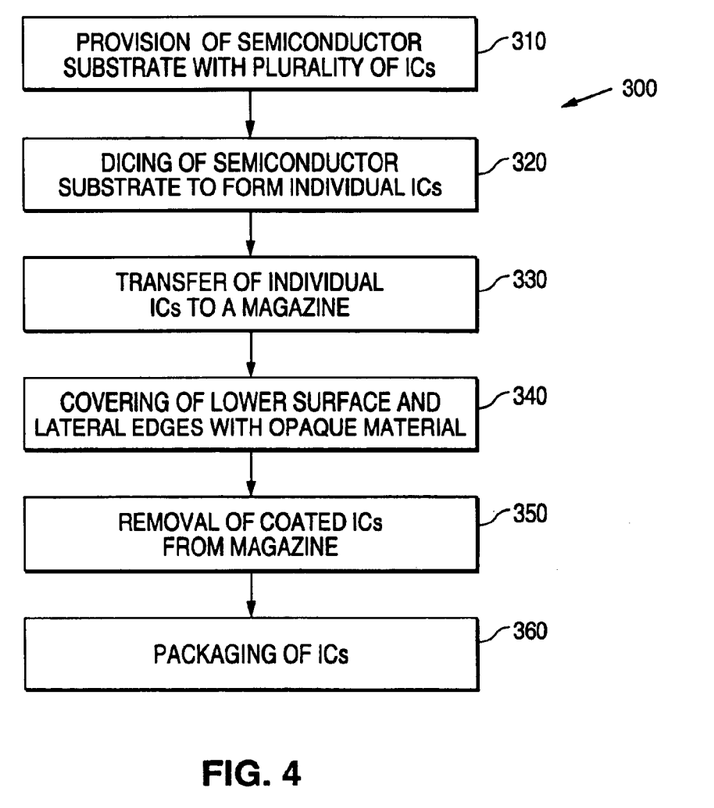
FIG. 4 is a flow diagram of a method for manufacturing a package-ready light-sensitive integrated circuit according to the present invention.

FIG. 4 is a flow diagram outlining the steps in a process 300 in accordance with the present invention for preparing a light-sensitive integrated circuit for packaging. First, at step 310, at least one semiconductor substrate with a plurality of light-sensitive integrated circuits (ICs) formed in and on an upper surface of the semiconductor substrate is provided. The semiconductor substrate is typically a silicon (Si) substrate in wafer form, although other semiconductor substrates known in the field can be employed in practicing the invention. The light-sensitive integrated circuit can be any light-sensitive integrated circuit known in the field, such as CMOS, Bipolar and BiCMOS light-sensitive integrated circuits, and can have solder bumps attached thereto.

Next, at step 320, the at least one semiconductor substrate is diced into individual light-sensitive integrated circuits.

The semiconductor substrate can be diced, for example, using conventional sawing techniques and apparatus known in the field. Each of the individual light-sensitive integrated circuits created in step 320 has a semiconductor substrate lower surface and semiconductor substrate lateral edges. The semiconductor substrate lateral edges of the light-sensitive integrated circuits have a height (i.e., the distance from the semiconductor substrate upper surface to the semiconductor substrate lower surface) of, for example, approximately 750 microns.

Subsequently, in step 330, the individual light-sensitive integrated circuits are transferred to a magazine. The magazine is adapted for holding a plurality of individual light-sensitive integrated circuits in a manner which provides for their semiconductor substrate lower surface and semiconductor substrate lateral edges to be covered with an opaque material in a subsequent process step, while precluding coverage of the semiconductor substrate upper surface. In order to provide a cost effective process, the magazine can be adapted to hold up to several thousand individual light-sensitive integrated circuits. The transfer of the individual light-sensitive integrated circuits into the magazine can be accomplished using, for example, a conventional integrated circuit pick-and-place apparatus.

Subsequently, in step 340, the semiconductor substrate lower surface and semiconductor substrate lateral edges of the individual light-sensitive integrated circuits are covered with an opaque material (i.e., a material that is impenetrable by light of wavelengths that are capable of interfering with the operation of the light-sensitive integrated circuit). This opaque material forms an opaque material layer covering the semiconductor substrate lower surface and semiconductor substrate lateral edges of the individual light-sensitive integrated circuits. The result is coated light-sensitive integrated circuits.

The thickness of the opaque material layer is sufficient to block essentially all light of wavelengths that can interfere with operation of the light-sensitive integrated circuits (e.g., visible light, light of infra-red wavelengths or ultra-violet light) from entering the semiconductor substrate through its lateral edges and lower surface. The thickness will, therefore, depend on the light blocking characteristics of the opaque material layer for the light wavelength(s) of interest. The opaque material layer can be formed, for example, of opaque ink, opaque paint, opaque epoxy, opaque molding compound or opaque resin.

Next, in step 350, the coated individual light-sensitive integrated circuits are removed from the magazine and are, for example, subsequently placed onto a substrate, such as a printed circuit board (PCB), to undergo a packaging process (see step 360 of FIG. 1). For instance, individual light-sensitive integrated circuits, which have been covered in step 350, can be placed on a PCB and then soldered to that PCB. Alternatively, the coated individual light-sensitive integrated circuits can be stored for later use or sale.

If desired, step 330 can entail transferring only individual light-sensitive integrated circuits that meet predetermined electrical characteristics. The determination of whether or not an individual light-sensitive integrated circuit meets such predetermined electrical characteristics can be made prior to dicing of the semiconductor substrate in step 320 using, for example, standard integrated circuit testing and sorting techniques.

Figure 5:
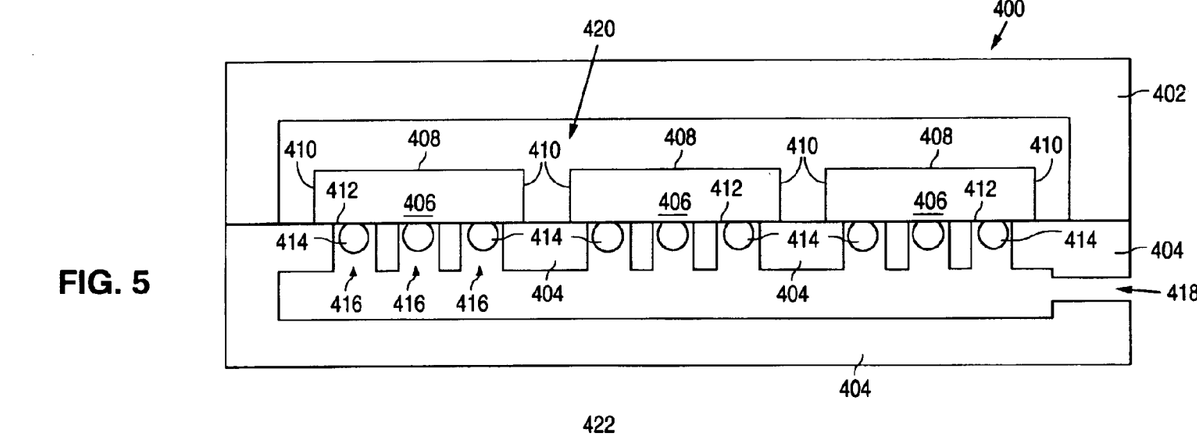
FIG. 5 is a cross-sectional view illustrating three individual light-sensitive integrated circuits following their transfer to a magazine in a process in accordance with the present invention.

FIG. 5 illustrates a magazine 400 for use in processes according to the present invention. Magazine 400 includes top magazine portion 402 and bottom magazine portion 404 that are separable from each other. The magazine 400 is adapted for holding a plurality of individual light-sensitive integrated circuits 406 in a manner which provides for their semiconductor substrate lower surfaces 408 and semiconductor substrate lateral edges 410 to be covered with an opaque material layer, while precluding coverage of the semiconductor substrate upper surface 412. In the magazine embodiment of FIG. 5, solder bumps 414 attached to the individual light-sensitive integrated circuits are disposed in openings 416 in the bottom magazine portion 404. The openings 416 are in communication with a bottom cavity 418 in order that vacuum can be applied to securely hold the individual light-sensitive integrated circuits 406 in place on the bottom magazine portion 404.

Magazine 400 is also adapted to provide for opaque molding compound or opaque epoxy to be injected into a top cavity 420 formed by securing top magazine portion 402 to bottom magazine portion 404. The injection of opaque molding compound or opaque epoxy into the top cavity 420 serves to cover the semiconductor substrate lateral edges 410 and the semiconductor substrate lower surfaces 408 of the individual light-sensitive integrated circuits with an opaque material layer. However, since the semiconductor substrate upper surface 412 is secured against the bottom magazine portion 404, the semiconductor substrate upper surface 412 is not covered with an opaque material layer. The result, after injection of the opaque molding compound (or opaque epoxy) to form an opaque material layer 422, is illustrated in FIG. 6.

Figure 6:
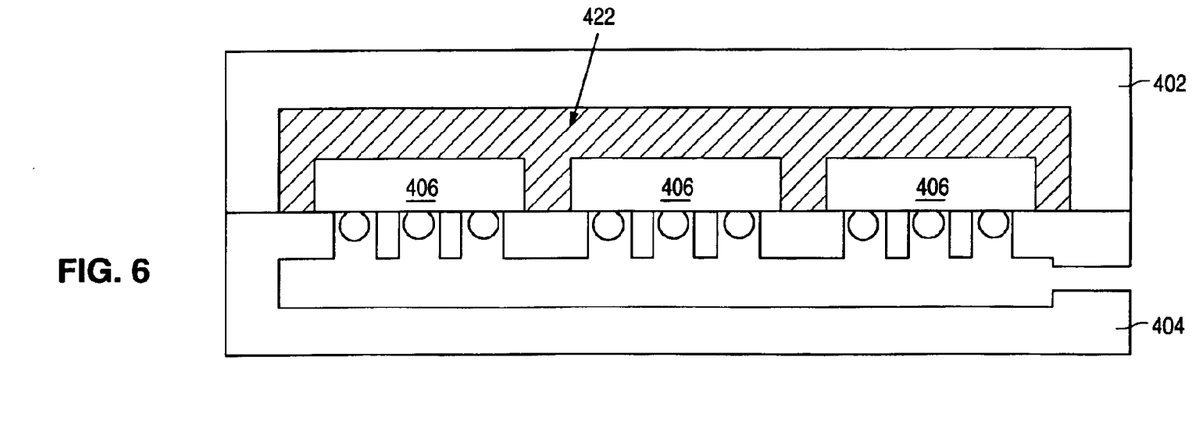
FIG. 6 is a cross-sectional view illustrating the magazine and individual light-sensitive integrated circuits of FIG. 5 after a covering step employing injection molding techniques.
Figure 7:
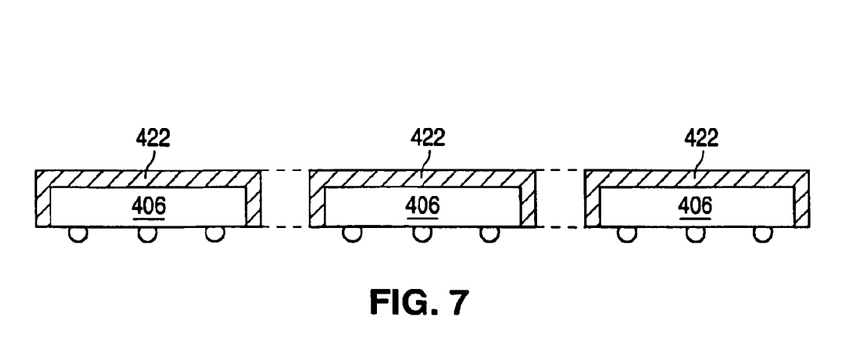
FIG. 7 is a cross-sectional view illustrating the individual light-sensitive integrated circuits of FIG. 6 after a trimming step.

As can be seen by reference to FIG. 6, the individual light-sensitive integrated circuits 406 have been joined together into a single unit (i.e., an undivided piece consisting of the individual light-sensitive integrated circuits and an opaque material layer) by the opaque material layer 422. After removal of the coated light-sensitive integrated circuits from the magazine 400, the coated light-sensitive integrated circuits can be separated from one another by trimming the excess opaque material layer surrounding each light-sensitive integrated circuit. The resulting package-ready light-sensitive integrated circuits are illustrated in FIG. 7, with the dashed lines representing the location of trimmed excess opaque material layer 422.

Figure 8:
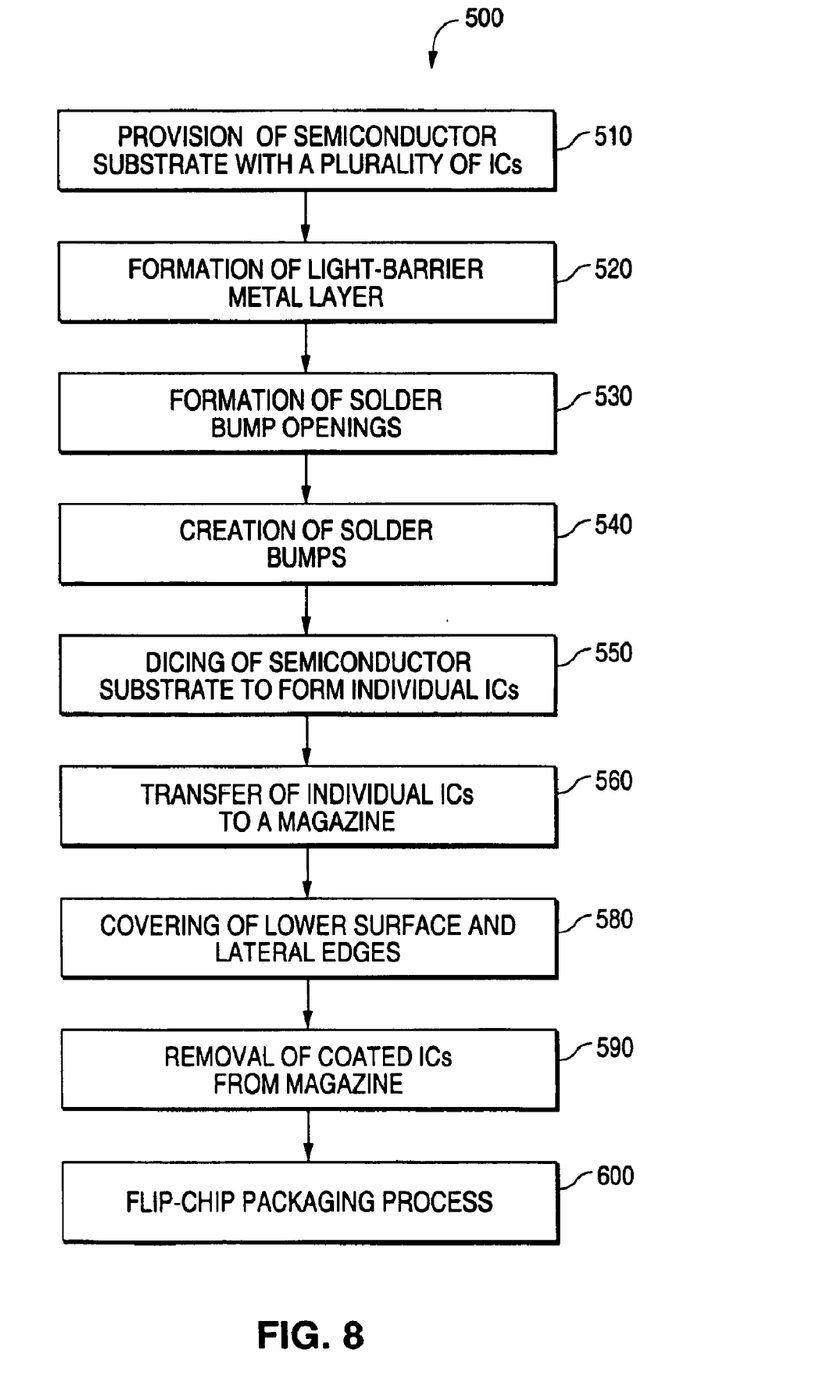
FIG. 8 is a flow diagram of another process for manufacturing a package-ready light-sensitive integrated circuit according to the present invention.

FIG. 8 is a flow diagram outlining the steps in another process 500 in accordance with the present invention for preparing a light-sensitive integrated circuit for packaging. First, at step 510, at least one semiconductor substrate (e.g., a silicon wafer) with a plurality of light-sensitive integrated circuits (ICs) formed in and on an upper surface of the semiconductor substrate is provided.

At step 520, a light-barrier metal layer is formed partially overlying the upper surface of the semiconductor substrate and the plurality of light-sensitive integrated circuits. The light-barrier metal layer can be a single layer of metal or a multi-layered metal composite. The purpose of the light-barrier metal layer is to prevent exposure of the plurality of light-sensitive integrated circuits to light. The formation of the light-barrier metal layer can be accomplished using conventional metal deposition techniques, such as metal sputtering.

Next, at step 530, solder bump openings are formed in the light-barrier metal layer such that the light-barrier metal layer only partially overlies the upper surface of the semiconductor substrate and the plurality of light-sensitive integrated circuits. The solder bump openings can be formed using conventional photo-masking and etching techniques. The diameter of the solder bump openings is dependent on the size of the solder bumps to be formed in a subsequent step. However, a typical diameter is in the range of 100 microns to 150 microns. Subsequently, at step 540, solder bumps are attached to the plurality of light-sensitive integrated circuits through the solder bump openings are created. The solder bumps can be created using standard solder bumping techniques known in the field.

Next, at step 550, the semiconductor substrate is diced into individual light-sensitive integrated circuits. The semiconductor substrate can be diced, for example, using conventional sawing techniques and apparatus. Each of the individual light-sensitive integrated circuits created in step 550 has a semiconductor substrate lower surface and semiconductor substrate lateral edges.

Then, in step 560, the individual light-sensitive integrated circuits are transferred to a magazine having the same characteristics as discussed above with respect to process 400. Subsequently, in step 570, the semiconductor substrate lower surface and semiconductor substrate lateral edges of the individual light-sensitive integrated circuits are covered with an opaque material to form an opaque material layer. The opaque material layer can be formed, for example, of opaque ink, opaque paint, opaque epoxy, opaque molding compound or opaque resin. The result is coated light-sensitive integrated circuits.

Next, in step 580, the individual light-sensitive integrated circuits are removed from the magazine and are, for example, subsequently placed onto a substrate (such as a printed circuit board [PCB]) to undergo a flip-chip packaging process. Alternatively, the coated individual light-sensitive integrated circuits can be stored for later use or sale.

Package-ready light-sensitive integrated circuits according to the present invention provide for a reduced exposure of individual light-sensitive integrated circuits to light and a relatively small package size. Processes for preparing a package-ready light sensitive integrated circuit according to the present invention are relatively inexpensive. In addition, when injection molding techniques are used for the covering step, the magazine and/or trimming step can be used to standardize the size of the package-ready light-sensitive integrated circuit.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A package-ready light-sensitive integrated circuit comprising:
    a semiconductor substrate having an upper surface, a lower surface, lateral edges, and an individual light-sensitive integrated circuit formed on the upper surface of the semiconductor substrate; and
    an opaque material layer covering the lower surface and lateral edges of the semiconductor substrate, the opaque material layer not being formed over any portion of the upper surface of the semiconductor substrate when the upper surface is positioned above the lower surface.

2. The package-ready light-sensitive integrated circuit of claim 1 and further comprising a plurality of solder bumps attached to make electrical connections with the individual light-sensitive integrated circuit.

3. The package-ready light-sensitive integrated circuit of claim 1, wherein the opaque material layer is formed of opaque molding compound.

4. The package-ready light-sensitive integrated circuit of claim 1, wherein the opaque material layer is formed of opaque epoxy.

5. The package-ready light-sensitive integrated circuit of claim 1, wherein the opaque material layer is formed of opaque ink.

6. The package-ready light-sensitive integrated circuit of claim 1, wherein the opaque material layer is formed of opaque paint.

7. The package-ready light-sensitive integrated circuit of claim 1, wherein the thickness of the opaque material layer is in the range of 0.003 inches to 0.011 inches.

8. A package-ready light-sensitive integrated circuit comprising:
    a semiconductor substrate having an upper surface, a lower surface, lateral edges, and an individual light-sensitive integrated circuit formed on the upper surface of the semiconductor substrate;
    an opaque material layer covering the lower surface and lateral edges of the semiconductor substrate, the opaque material layer not being formed over any portion of the upper surface of the semiconductor substrate when the upper surface is positioned above the lower surface;
    a plurality of solder bumps attached to make electrical connections with the individual light-sensitive integrated circuit; and
    a light barrier metal layer formed over the upper surface of the semiconductor substrate when the upper surface is positioned above the lower surface, the light barrier metal layer having a plurality of openings, the solder bumps being formed through the openings, the light barrier metal layer being spaced apart and electrically isolated from the solder bumps.

9. A semiconductor device comprising:
    a semiconductor substrate having an upper surface, a lower surface, lateral edges, and an integrated circuit formed on the upper surface of the semiconductor substrate;
    a plurality of solder bumps connected to make electrical connections with the integrated circuit, a peripheral solder bump being formed such that no other solder bump lies between the peripheral solder bump and a lateral edge; and
    an opaque material layer covering the lower surface and lateral edges of the semiconductor substrate, the opaque material layer not being formed over a peripheral region of the upper surface of the semiconductor substrate when the upper surface is positioned above the lower surface, the peripheral region being spaced apart from the lateral edge, and lying between the peripheral solder bump and the lateral edge.

10. A semiconductor device comprising:
    a semiconductor substrate having an upper surface, a lower surface, lateral edges, and an integrated circuit formed on the upper surface of the semiconductor substrate;
    a plurality of solder bumps connected to make electrical connections with the integrated circuit, a peripheral solder bump being formed such that no other solder bump lies between the peripheral solder bump and a lateral edge;
    an opaque material layer covering the lower surface and lateral edges of the semiconductor substrate, the opaque material layer not being formed over a peripheral region of the upper surface of the semiconductor substrate when the upper surface is positioned above the lower surface, the peripheral region being spaced apart from the lateral edge, and lying between the peripheral solder bump and the lateral edge; and a light-barrier metal layer formed over the upper surface of the semiconductor substrate when the upper surface is positioned above the lower surface, the light barrier metal layer having a plurality of openings, the solder bumps being formed through the openings, the light barrier metal layer being spaced apart and electrically isolated from the solder bumps.

11. A semiconductor device comprising:

a semiconductor structure having a first surface, a second surface spaced apart from the first surface, a plurality of side walls that contact the first and second surfaces, and an individual light-sensitive integrated circuit formed on the first surface of the semiconductor structure; and an opaque material layer contacting the second surface and the side walls of the semiconductor structure, the opaque material layer not being formed over any portion of the first surface of the semiconductor structure when the first surface is positioned above the second surface.

12. The semiconductor device of claim 11 and further comprising a plurality of solder bumps attached to make electrical connections with the individual light-sensitive integrated circuit.

13. A semiconductor device comprising:

a semiconductor structure having a first surface, a second surface spaced apart from the first surface, a plurality of side walls that contact the first and second surfaces, and an individual light-sensitive integrated circuit formed on the first surface of the semiconductor structure;

an opaque material layer contacting the second surface and the side walls of the semiconductor structure, the opaque material layer not being formed over any portion of the first surface of the semiconductor structure when the first surface is positioned above the second surface;

a plurality of solder bumps attached to make electrical connections with the individual light-sensitive integrated circuit; and a light barrier metal layer formed over the first surface of the semiconductor substrate when the first surface is positioned above the second surface, the light barrier metal layer having a plurality of openings, the solder bumps being formed through the openings, the light barrier metal layer being spaced apart and electrically isolated from the solder bumps.

14. A semiconductor device comprising:

a semiconductor structure having a first surface, a second surface spaced apart from the first surface, a plurality of side walls that contact the first and second surfaces, and an individual light-sensitive integrated circuit formed on the first surface of the semiconductor structure; and an opaque material layer contacting the second surface and the side walls of the semiconductor structure, the opaque material layer not being formed under any portion of the first surface of the semiconductor structure when the first surface is positioned below the second surface.

15. The semiconductor device of claim 14 and further comprising a plurality of solder bumps attached to make electrical connections with the individual light-sensitive integrated circuit.

16. A semiconductor device comprising:

a semiconductor structure having a first surface, a second surface spaced apart from the first surface, a plurality of side walls that contact the first and second surfaces, and an individual light-sensitive integrated circuit formed on the first surface of the semiconductor structure;

an opaque material layer contacting the second surface and the side walls of the semiconductor structure, the opaque material layer not being formed under any portion of the first surface of the semiconductor structure when the first surface is positioned below the second surface;

a plurality of solder bumps attached to make electrical connections with the individual light-sensitive integrated circuit; and a light barrier metal layer formed under the first surface of the semiconductor substrate when the first surface is positioned below the second surface, the light barrier metal layer having a plurality of openings, the solder bumps being formed through the openings, the light barrier metal layer being spaced apart and electrically isolated from the solder bumps.

17. A semiconductor device comprising:

a semiconductor structure having a first surface, a second surface spaced apart from the first surface, a plurality of side walls that contact the first and second surfaces, and an integrated circuit formed on the first surface of the semiconductor structure;

a metal layer formed on the first surface of the semiconductor structure, the metal layer having a plurality of openings that expose the integrated circuit; and a plurality of solder bumps formed through the openings such that each opening has a solder bump formed through the opening to make an electrical connection with the integrated circuit.

18. The semiconductor device of claim 17 wherein the solder bumps have sizes, and the openings have diameters that are a function of the sizes of the solder bumps formed in the openings.

19. The semiconductor device of claim 17 wherein the solder bumps are electrically isolated from the metal layer.

20. The semiconductor device of claim 17 wherein the metal layer blocks substantially all light from passing through the first surface.

21. The semiconductor device of claim 17 and further comprising an opaque material layer that contacts the second surface and the side walls of the semiconductor structure.

* * * * *

UNITED STATES PATENT AND TRADEMARK OFFICE
CERTIFICATE OF CORRECTION

PATENT NO. : 6,876,052 B1
DATED : April 5, 2005
INVENTOR(S) : Tai

It is certified that error appears in the above-identified patent and that said Letters Patent is hereby corrected as shown below:

Please delete drawing sheet Figures 1-3 and insert replacement sheet Figures 1-3.

Column 3,
Lines 29 and 30, delete "In" and replace with -- in --.

Signed and Sealed this

Twenty-fifth Day of October, 2005

JON W. DUDAS
*Director of the United States Patent and Trademark Office*